United States Patent
Yamamoto et al.

(10) Patent No.: US 10,811,252 B2
(45) Date of Patent: Oct. 20, 2020

(54) PATTERN-FORMING METHOD

(71) Applicant: TOSHIBA MEMORY CORPORATION, Tokyo (JP)

(72) Inventors: Ryosuke Yamamoto, Nagoya Aichi (JP); Ryuichi Saito, Kawasaki Kanagawa (JP); Seiji Morita, Tokyo (JP); Ryoichi Suzuki, Yokohama Kanagawa (JP); Takeharu Motokawa, Zushi Kanagawa (JP); Shinichi Ito, Yokohama Kanagawa (JP); Soichi Inoue, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 117 days.

(21) Appl. No.: 16/117,888

(22) Filed: Aug. 30, 2018

(65) Prior Publication Data
US 2019/0259606 A1    Aug. 22, 2019

(30) Foreign Application Priority Data

Feb. 22, 2018 (JP) .................................. 2018-029905

(51) Int. Cl.
| | |
|---|---|
| *H01L 21/02* | (2006.01) |
| *H01L 21/027* | (2006.01) |
| *H01L 21/033* | (2006.01) |
| *H05K 3/12* | (2006.01) |
| *G03F 7/40* | (2006.01) |
| *H01L 21/3105* | (2006.01) |
| *H01L 21/311* | (2006.01) |

(Continued)

(52) U.S. Cl.
CPC ...... *H01L 21/02282* (2013.01); *G03F 7/0002* (2013.01); *G03F 7/40* (2013.01); *G03F 7/405* (2013.01); *H01L 21/0273* (2013.01); *H01L 21/0276* (2013.01); *H01L 21/02115* (2013.01); *H01L 21/0332* (2013.01); *H01L 21/0337* (2013.01); *H01L 21/31058* (2013.01); *H01L 21/31144* (2013.01); *H01L 27/115* (2013.01); *H05K 3/1258* (2013.01)

(58) Field of Classification Search
None
See application file for complete search history.

(56) References Cited

U.S. PATENT DOCUMENTS

| | | | |
|---|---|---|---|
| 2017/0042038 A1 | 2/2017 | Hamaguchi et al. | |
| 2017/0343896 A1* | 11/2017 | Darling | G03F 7/0002 |
| 2017/0352550 A1* | 12/2017 | Tois | H01L 21/02178 |

FOREIGN PATENT DOCUMENTS

| | | |
|---|---|---|
| JP | 4695360 B2 | 6/2011 |
| JP | 2015126079 A | 7/2015 |

OTHER PUBLICATIONS

U.S. Appl. No. 15/891,400.

* cited by examiner

*Primary Examiner* — Mounir S Amer
(74) *Attorney, Agent, or Firm* — Kim & Stewart LLP

(57) ABSTRACT

A pattern-forming method includes forming a first film above a material to be processed, processing the first film into a pattern to be formed in the material to be processed, providing a second film on the first film and the material to be processed, supplying a precursor containing at least one of a metal material or a semiconductor material to the second film, removing the first film, and processing the material to be processed using the second film impregnated with at least one of the metal material and the semiconductor material, as a mask.

20 Claims, 7 Drawing Sheets

(51) Int. Cl.
*H01L 27/115* (2017.01)
*G03F 7/00* (2006.01)

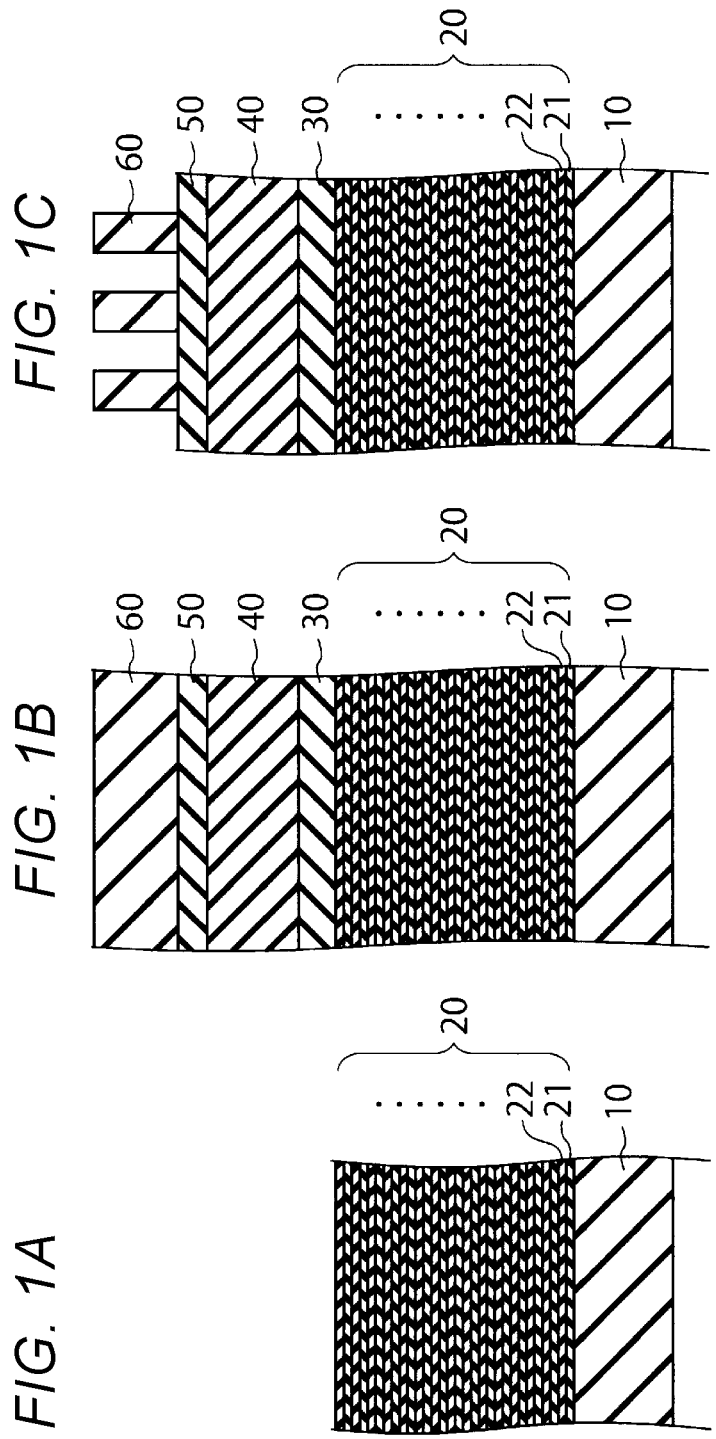

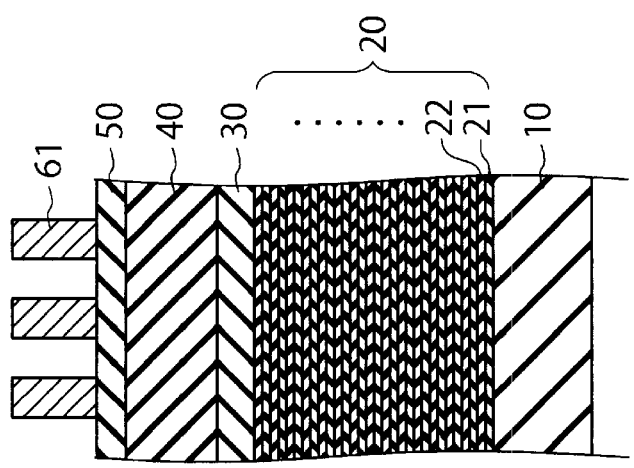
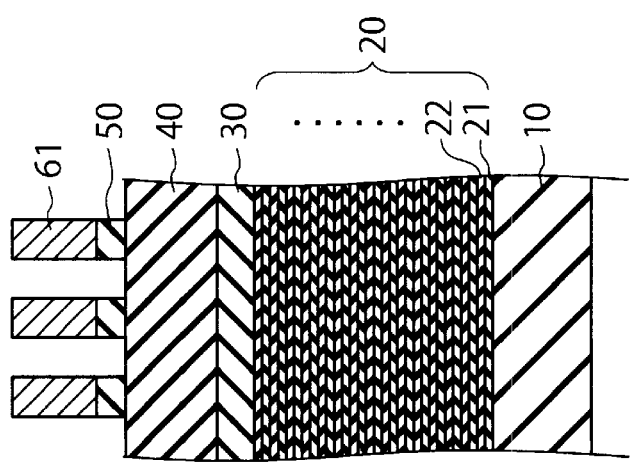
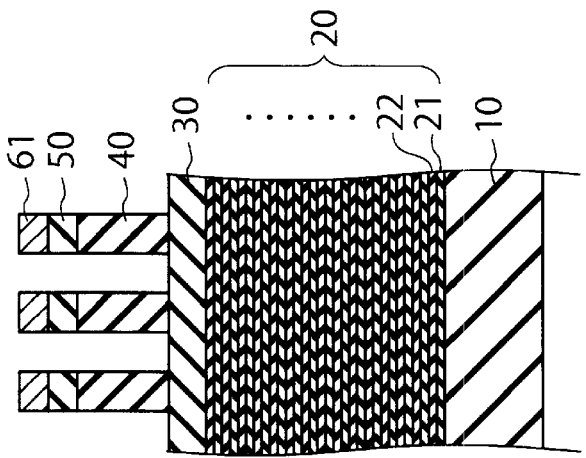

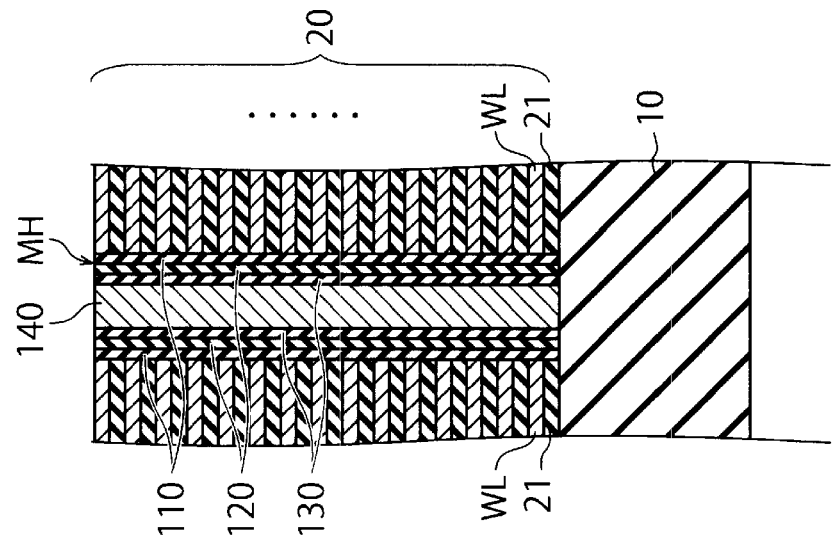
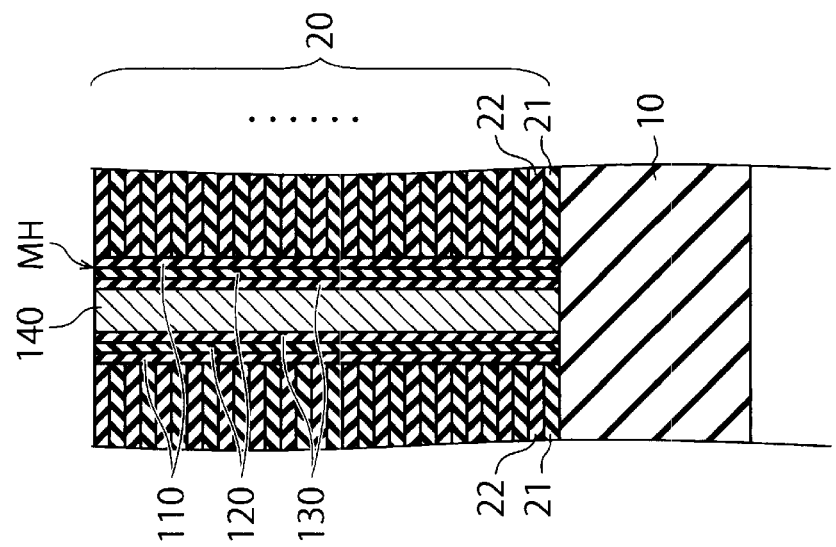

PATTERN-FORMING METHOD

CROSS-REFERENCE TO RELATED APPLICATION

This application is based upon and claims the benefit of priority from Japanese Patent Application No. 2018-029905, filed on Feb. 22, 2018, the entire contents of which are incorporated herein by reference.

FIELD

The present embodiment relates to a pattern-forming method.

BACKGROUND

In the manufacturing of semiconductor devices, spin-on carbon (SOC) films or high-density films produced by chemical vapor deposition, such as carbon films formed by chemical vapor deposition (CVD-C), are used as masks in lithographic processes to fabricate materials with high-aspect ratio patterns. In order to further improve the etching resistance of such masks and further increase the aspect ratio of the features in the materials to be processed, metallization of the masks is considered.

However, compared with resists made of resins, films made of a material having a high density, such as SOC or CVD-C, are difficult to impregnate with metal and are difficult to metallize.

DESCRIPTION OF THE DRAWINGS

FIGS. 1A, 1B and 1C are cross-sectional views for showing an example of a method for manufacturing a semiconductor device according to a first embodiment.

FIGS. 2A, 2B and 2C are cross-sectional views for showing the example of the method for manufacturing a semiconductor device continued from FIGS. 1A, 1B and 1C.

FIGS. 6A and 6B are cross-sectional views for showing the example of the method for manufacturing a semiconductor device, continued from FIGS. 5A, 5B and 5C.

DETAILED DESCRIPTION

Figure 3A:
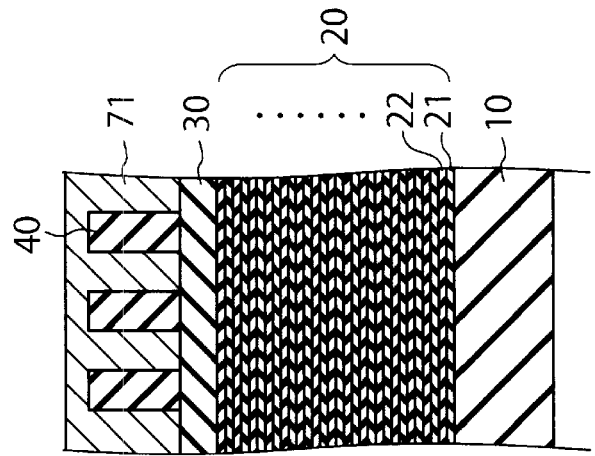
FIGS. 3A, 3B and 3C are cross-sectional views for showing the example of the method for manufacturing a semiconductor device continued from FIGS. 2A, 2B and 2C.

A pattern-forming method capable of forming, through metallization, a mask with high etching resistance, is presented.

The pattern-forming method according to the present embodiment includes forming a first film above a material to be processed, processing the first film into a pattern to be formed in the material to be processed, providing a second film on the first film and the material to be processed, supplying a precursor containing at least one of a metal material or a semiconductor material to the second film, removing the first film, and processing the material to be processed using the second film impregnated with at least one of the metal material and the semiconductor material, as a mask.

Hereinafter, embodiments of the present disclosure will be described with reference to the drawings. The present embodiment does not limit the present disclosure. In the following embodiments, the vertical direction of the semiconductor substrate indicates the relative direction when the surface on which the semiconductor element is provided is facing up, and may be different from the vertical direction defined by gravitational acceleration. The drawings are schematic or conceptual, and the proportions of parts and the like are not necessarily the same as the actual ones. In the specification and drawings, elements similar to those described above with reference to the previous drawings are denoted by the same reference numerals, and a detailed description thereof is omitted as appropriate.

First Embodiment

FIGS. 1A to 6B are cross-sectional views for description of an example of a method for manufacturing the semiconductor device 1 according to a first embodiment. The semiconductor device 1 may be, for example, a NAND-type EEPROM (Electrically Erasable Programmable Read-Only Memory). The NAND-type EEPROM has, for example, a three-dimensional memory cell array and a peripheral circuit, which is provided on the same board as the memory cell array and controls the memory cell array. The peripheral circuit is provided on the semiconductor substrate, and the memory cell array is provided above the peripheral circuit.

The embodiment described below is used to form memory holes of a NAND-type EEPROM. However, the present disclosure is not limited to this, and the following embodiment may be used for other semiconductor devices.

In FIGS. 1A to 6B, the peripheral circuit is already formed on a semiconductor substrate, and the memory cell array is formed above the peripheral circuit.

After the peripheral circuit is formed on the semiconductor substrate, an interlayer insulating film 10 is formed on the peripheral circuit. Next, as shown in FIG. 1A, a stacked body 20 of alternating silicon oxide films 21 and silicon nitride films 22 is formed on the interlayer insulating film 10. The silicon nitride films 22 are replaced with a conductive material such as tungsten in a later step. The conductive material functions as a word line (WL in FIG. 6B). The silicon oxide films 21 are provided to insulate word lines adjacent to each other in the stacking direction of the stacked body 20, i.e., in the direction perpendicular to the surface of the semiconductor substrate.

The stacked body 20 is subsequently processed as a material to be processed. For example, a pattern having a high-aspect ratio, such as a memory hole, is formed later in the stacked body 20.

Next, as shown in FIG. 1B, an amorphous silicon layer 30 is formed on top of the stacked body 20. Subsequently, a sacrificial film 40 as a first film is formed on top of the amorphous silicon layer 30. For example, a carbon film such as a CVD-C or SOC film is used as the sacrificial film 40 in order to form a pattern having a high-aspect ratio. Next, an anti-reflection film 50 is formed on the sacrificial film 40. The anti-reflection film 50 is, for example, an organic material such as a methacrylic resin containing a substituent having an absorption band in the exposure wavelength region. Next, a resist film 60 is applied on the anti-reflection film 50. In the step of exposing the resist film 60, the anti-reflection film 50 suppresses reflection from the sacrificial film 40 and suppresses excessive exposure of the resist film 60 to reflected light.

Next, the resist film 60 is patterned as shown in FIG. 1C by using a lithography technique. At this time, the resist film 60 is patterned into a reverse pattern of a pattern to be transferred to the stacked body 20 as a material to be processed. The lithography technique may be photolithography technique, Nano-Imprint Lithography (NIL), Directed Self-Assembly (DSA), and so on.

The resist film 60 is patterned so as to have an opening pattern to be transferred into the stacked body 20. The removed pattern is the pattern of the portion removed in the etching process of the stacked body 20. The remaining pattern is an inverted or reversed version of the removed pattern, and is the pattern of the portion remaining in the etching process of the stacked body 20.

Next, as shown in FIG. 2A, the resist film 60 is metallized, and thus modified to a metal-containing resist film 61. In the metallization treatment, for example, an organic aluminum compound such as trimethyl aluminum (TMA), an aluminum halide such as AlCl3, an organic titanium compound such as tetrakis(dimethylamino)titanium (TDMAT), a titanium halogen compound such as TiCl4, or the like is used as a precursor, and metal atoms such as aluminum or titanium are impregnated in the resist film 60. As a result, the resist film 60 becomes a metal-containing resist film 61 that is relatively resistant to dry etching.

Next, as shown in FIG. 2B, the anti-reflection film 50 is processed by dry etching using the metal-containing resist film 61 as a mask. As a result, the pattern of memory holes is transferred into the anti-reflection film 50.

Next, the sacrificial film 40 is processed by dry etching using the metal-containing resist film 61 and the anti-reflection film 50 as masks. As a result, as shown in FIG. 2C, the pattern of memory holes is transferred into the sacrificial film 40.

The sacrificial film 40 is also patterned and it remains on the stacked body 20. In the case where the pattern of material to be removed from the stacked body 20 is a hole pattern, the sacrificial film 40 is formed into a column pattern. Since the sacrificial film 40 is made of a carbon film such as CVD-C or SOC, the sacrificial film 40 can be formed into elongated columnar shapes.

Figure 3B:
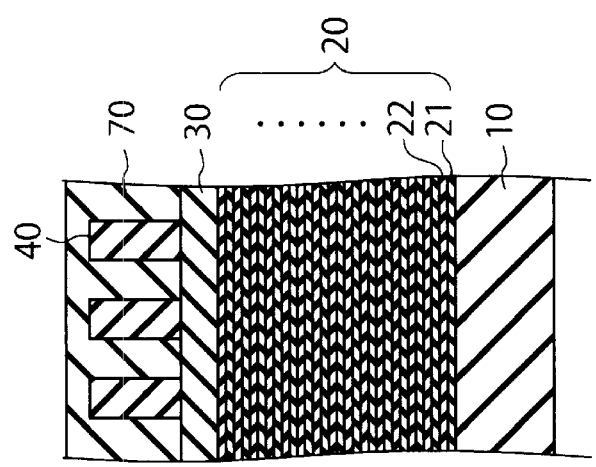

Next, as shown in FIG. 3A, the metal-containing resist film 61 and the anti-reflection film 50 on the sacrificial film 40 are removed. Next, as shown in FIG. 3B, a resin film 70, as a second film, is applied on the amorphous silicon layer 30 and the sacrificial film 40. The resin film 70 also fills the spaces in the pattern of the sacrificial film 40. The resin film 70 is made of a material that is easier to metallize than the sacrificial film 40 which is derived from a carbon film such as a CVD-C or SOC film. It is preferable that the resin film 70 be a resin containing a carbonyl group which easily forms a complex with a precursor containing a metal material, or a substituent having a non-covalent electron pair such as a pyridine ring. The resin film 70 may be a resin based on an acrylic acid ester or a methacrylic acid ester copolymer. For example, a methacrylic resin derivative having an ester skeleton with a carbonyl group is desirable for the resin film 70, and PMMA (polymethylmethacrylate), PXMA (polyxylomethylmethacrylate), PAcMA (polyacetonyl methacrylate), or the like is used. A resist material having a methacrylic resin as a skeleton can also be used.

Figure 7:
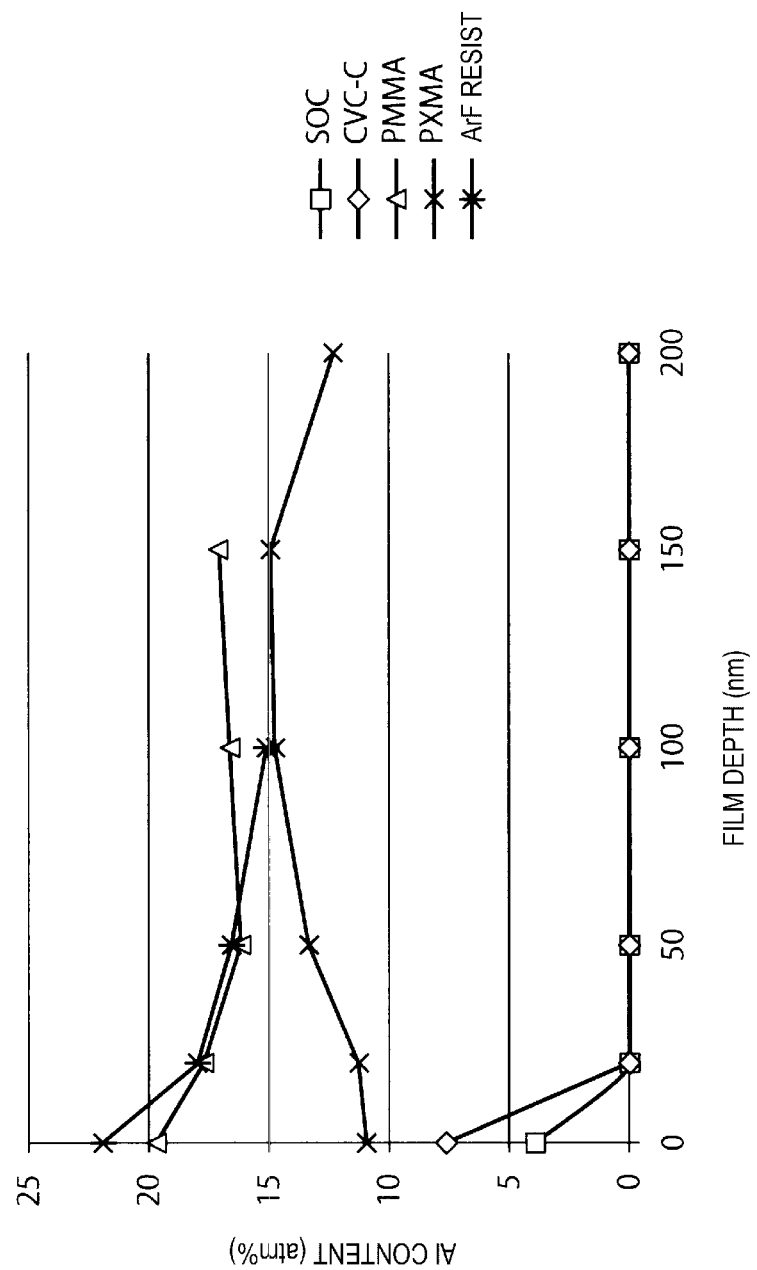
FIG. 7 is a graph showing an example of metal content when a resin film is metallized.

FIG. 7 is a graph showing an example of the metal content in the resin film when the resin film 70 is metallized. For the resin film 70, a CVD-C film, an SOC film, a PMMA or PXMA resin, or an ArF resist is used. The metal to be impregnated in the resin film 70 is, for example, aluminum. The analysis of the metal film was performed by XPS measurement in the depth direction. As a result, 5 to 10 atm % (atomic percent) of aluminum was detected near the surface of the CVD-C and SOC films. However, aluminum was hardly detected within the CVD-C and SOC films. On the other hand, 10 to 20 atm % of aluminum was detected in the PMMA and PXMA resins and the ArF resist, even within the bulk film. This means that the PMMA and PXMA resins and the ArF resist are more easily impregnated with metals than the CVD-C and SOC films.

A precursor containing metal material is supplied to the resin film 70 made of a material having a methacrylic resin as a skeleton or backbone, such as a PMMA or PXMA resin, or an ArF resist, which is easily metallized in the manner described above. As the precursor, for example, an organometallic compound containing a metal material such as aluminum, chromium, manganese, molybdenum, tungsten, zirconium, or hafnium, a halide, or the like is used.

For the organometallic compound, TMA, bis(cyclopentadienyl)chromium (Cr(C2H5)2), cyclopentadienyl manganese tricarbonyl ((C5H5)Mn(CO)3), TDMAT, tetrakiethylmethylaminotitane (TEMAT), titanium tetraethylaminodibutoxide (Ti(OtBu)4), tetrakiethylaminodilkonium (TEMAZ), tetrakis(dimethylamino)zirconium (TDMAZ), zirconium tert-butoxide (Zr(OtBu)4), tetrakis (dimethylamino)hafnium (TDMAH), tetrakis(ethylmethylamino)hafnium (TEMAH), tetrakis (diethylamino) hafnium (TDEAH), hafnium tert-butoxide (Hf(OtBu)4), or the like can be used, for example. For the halide precursor, AlCl3, MoF6, WF6, TiCl4, ZrCl4, HfCl4, or the like can be used.

Figure 3C:
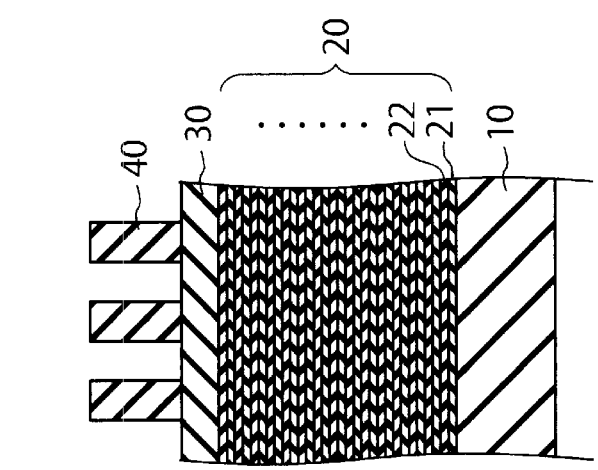

Next, the supplied precursor diffuses into the resin film 70 and is distributed throughout the film. Next, by oxidation with H2O, O3, or O2 plasma, the precursor reacts and is fixed in the resin, thereby completing the impregnation process. As a result, as shown in FIG. 3C, the resin film 70 becomes metallized. The resin film 70, for example, becomes a metallized PMMA or PXMA resin. At this time, since the sacrificial film 40 is derived from a dense carbon film such as a CVD-C or SOC film, the sacrificial film 40 is hardly metallized, and the resin film 70 is selectively metallized. Hereinafter, the metallized resin film 70 is referred to as a hard mask 71. The hard mask 71 is impregnated with a metal material such as aluminum, chromium, manganese, molybdenum, tungsten, zirconium, or hafnium.

It should be noted that heat treatment may be performed while supplying the precursor to the resin film 70 to have the precursor react with the resin film 70. In this way, the manufacturing process of the semiconductor device 1 can be shortened.

Figure 4A:
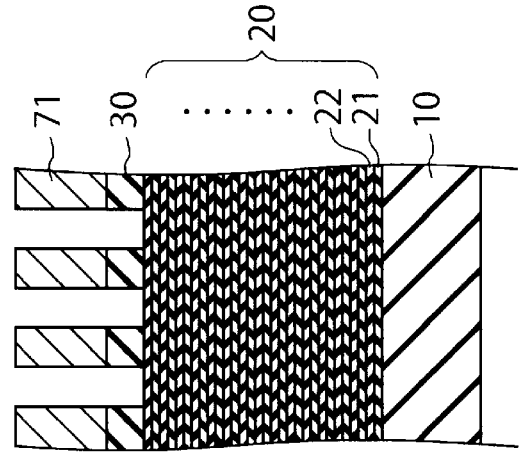
FIGS. 4A, 4B and 4C are cross-sectional views for showing the example of the method for manufacturing a semiconductor device continued from FIGS. 3A, 3B and 3C.

Next, the hard mask 71 is polished by chemical mechanical polishing (CMP) until the sacrificial film 40 is exposed as shown in FIG. 4A. In order to expose the sacrificial film 40 as shown in FIG. 4A, the hard mask 71 may be etched back by dry etching. At this time, as the gas type for dry etching, an etching gas corresponding to the metal type to not etch the metal may be selected. Alternatively, the sacrificial film 40 may be etched back by ion beam etching using Ar ions or the like.

Figure 4B:
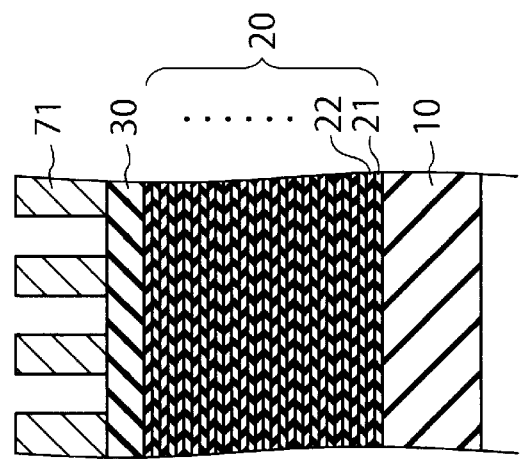

Next, as shown in FIG. 4B, the sacrificial film 40, as the first film, is selectively removed by reactive ion etching (RIE) while leaving the hard mask 71, as the second film. Since the sacrificial film 40 is removed from the stacked body 20, the hard mask 71 is left as an inverted or reversed pattern of the removed pattern, that is, the remaining pattern of the stacked body 20. Therefore, when memory holes are formed in the stacked body 20, a hole pattern having a high-aspect ratio can be formed in the hard mask 71. By forming the hard mask 71 with the hole pattern to be formed in the stacked body 20, the hard mask 71 can be used as a mask for etching the stacked body 20.

Figure 4C:
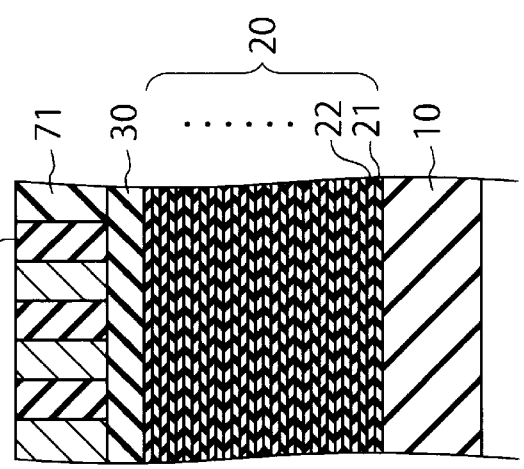

Next, as shown in FIG. 4C, the amorphous silicon layer 30 is processed by reactive ion etching (RIE) using the hard mask 71 as a mask.

Figure 5A:
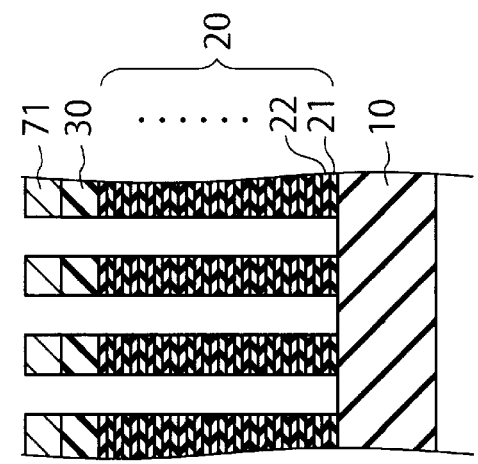
FIGS. 5A, 5B and 5C are cross-sectional views for showing the example of the method for manufacturing a semiconductor device, continued from FIGS. 4A, 4B and 4C.

Next, as shown in FIG. 5A, the stacked body 20 is processed by RIE using the hard mask 71 as a mask. At this time, the hard mask 71 is a metallized resin, and has sufficient resistance to the etchant as compared with the stacked body 20 made from silicon oxide and silicon nitride films. The resin film 70 is patterned using the sacrificial film 40 made of a carbon film. Therefore, the hard mask 71 is also formed to be sufficiently thick, and the hole pattern of the hard mask 71 can have a sufficiently high-aspect ratio. In this way, the thick stacked body 20 can be processed using the hard mask 71. Further, a hole pattern having a high-aspect ratio can be formed in the stacked body 20.

Further, the process selectivity (i.e., etching resistance) of the hard mask 71 as compared to that of the stacked body 20 is higher than the process selectivity (i.e., etching resistance) of the sacrificial film 40 as compared to that of the stacked body 20. Therefore, a smaller thickness of the hard mask 71 can be used compared to a normal resist film, and since the height of the hard mask 71 can be lowered, the height of the sacrificial film 40 can also be lowered. This improves the throughput of forming the sacrificial film 40 and the resin film 70 as well as the throughput of the etching process because the deposition and etching steps are shorter in duration.

Figure 5B:
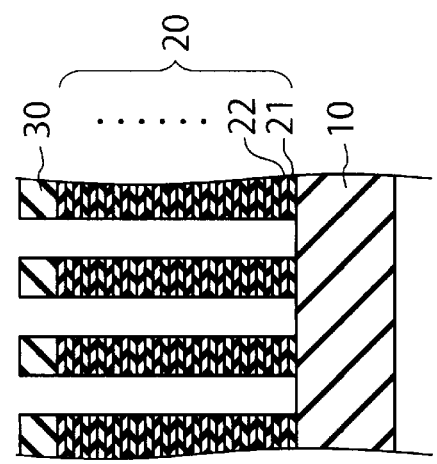
Figure 5C:
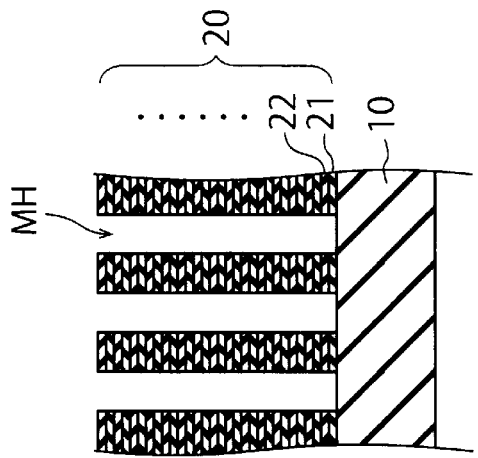

Next, the hard mask 71 is removed, whereby the structure shown in FIG. 5B is obtained. Further, by removing the amorphous silicon layer 30, memory holes MH are formed in the stacked body 20 as shown in FIG. 5C.

Next, as shown in FIG. 6A, a block film 110, a charge trapping film 120, a tunnel film 130, and a core 140 are formed in this order inside each memory hole MH. FIGS. 6A and 6B are cross-sectional views of one memory hole MH and its periphery. Referring to FIGS. 6A and 6B, the process and structure after formation of the memory hole MH will be described.

The block film 110 is provided between the charge trapping film 120 and the word line WL shown in FIG. 6B, and functions to prevent the charge trapped in the charge trapping film 120 from leaking to the word line. For the block film 110, for example, a silicon oxide film is used.

When data is written, the charge trapping film 120 takes in charges (e.g., electrons) from the channel portion of the core 140 through the tunnel film 130, and traps the charges within it. Data can be written to each memory cell by trapping charge in the portion of the charge trapping film 120 corresponding to the word line WL. Conversely, the charge trapping film 120 discharges charges to the channel portion through the tunnel film 130 at the time of data erasing. The data of each memory cell can be erased by discharging the charge in the portion of the charge trapping film 120 corresponding to the word line WL. For the charge trapping film 120, for example, a silicon nitride film is used.

The tunnel film 130 suppresses the charge trapped in the charge trapping film 120 from leaking to the channel portion while allowing the charge to pass between the channel portion and the charge trapping film 120 at the time of data writing and data erasing. For the tunnel film 130, for example, a silicon oxide film is used.

The core 140 has, for example, a pillar-shape of a prism or a cylinder. The tunnel film 130, the charge trapping film 120, and the block film 110 are provided on the side surface of the core 140, and have a pillar-structure as a whole. The core 140 functions as a channel portion of the memory cell. For the core 140, for example, polysilicon is used.

Thereafter, a slit (not shown) is formed in the stacked body 20, and the silicon nitride film 22 is removed through the slit by etching. As shown in FIG. 6B, instead of the silicon nitride film 22, a metal such as tungsten is formed between silicon oxide films 21 adjacent to each other in the stacking direction of the stacked body 20. Thus, a word line WL made of a metal such as tungsten is formed.

Thereafter, contact plugs and bit lines (not shown) electrically connected to the core 140 are formed to complete the NAND-type EEPROM.

A memory cell is provided corresponding to the intersection of the word line WL and the pillar structure. Consequently, data can be written in the memory cell corresponding to the word line WL by capturing charges in the portion of the charge trapping film 120 corresponding to the word line WL.

As described above, according to the present embodiment, the removal pattern of the stacked body 20 is formed by using the sacrificial film 40 made of a carbon film, such as a CVD-C or SOC film, and the remaining pattern of the stacked body 20 (i.e., the inverted or reverse pattern of the sacrificial film 40) is formed by using the metallized hard mask 71. In this way, the hard mask 71 can have sufficient etching resistance and thickness to form a pattern, such as a memory hole MH pattern, that has a high-aspect ratio. As a result, a memory hole MH having a high-aspect ratio can be formed in the stacked body 20.

On the other hand, a carbon film, such as a CVD-C or SOC film, is inferior to the metallized hard mask 71 in terms of etching resistance. Therefore, if the stacked body 20 is etched using a carbon film, such as a CVD-C or SOC film, as a mask, the aspect ratio of the memory hole formed in the stacked body 20 is lower than the aspect ratio of the memory hole MH formed in the present embodiment. Further, it is difficult to metallize a carbon film, such as a CVD-C or SOC film, with a precursor, and it is difficult to increase the etching resistance.

On the other hand, a pattern of the sacrificial film 40 made of a carbon film is used to form the inverted or reverse pattern in the resin film 70. By metallizing the resin film 70, a metallized hard mask 71 having higher etching resistance than that of the carbon film can be formed. Thus, a fine pattern having an aspect ratio equivalent to that of the carbon film can be formed with the hard mask 71 having high etching resistance. As a result, the stacked body 20 as the material to be processed can be processed into a fine pattern having high-aspect ratio openings.

(Modification)

In the above embodiment, the hard mask 71 is formed by metallizing a resin. However, the hard mask 71 may be formed by impregnating a resin with a semiconductor material. As described above, even in the hard mask 71 including the semiconductor material, the etching resistance can be made higher than that of the sacrificial film 40 derived from a carbon film. In this case, an organic semiconductor compound containing a semiconductor material such as silicon, germanium, or zinc may be used as the precursor. The other steps of this modification may be the same as the corresponding steps of the above embodiment.

As described above, even when a hard mask 71 impregnated with the semiconductor material is used, the effect of the present embodiment is not lost.

The above embodiment and the modification are used for forming memory holes MH in a stacked body 20. However, the method of manufacturing the semiconductor device 1 according to the embodiment and the modification may be used for forming other patterns in other materials.

Second Embodiment

In the first embodiment, the resist film 60 is metallized to be transformed into a metal-containing resist film 61. On the other hand, the second embodiment is different in that the resist film 60 is used as it is without being subjected to a metallization treatment.

For example, as described with reference to FIGS. 1A to 1C, the amorphous silicon layer 30, the sacrificial film 40, the anti-reflection film 50, and the resist film 60 are formed on top of the stacked body 20. For the anti-reflection film 50, for example, a silicon-containing dielectric film, such as SiO2 or SiON, is used. The anti-reflection film 50 may be formed by applying a spin-on glass (SOG) material and performing a baking treatment, or may be formed by using a chemical vapor deposition (CVD) device. Further, an anti-reflection film of an organic material may be additionally provided between the anti-reflection film 50 and the resist film 60.

Next, the anti-reflection film 50 is processed with a dry etching method using the resist film 60 as a mask without metallization. In this way, the pattern of the resist film 60 is transferred to the anti-reflection film 50.

Next, the sacrificial film 40 is etched by a dry etching method using the resist film 60 and the anti-reflection film 50 as masks.

Thereafter, as described with reference to FIGS. 3A to 5C, the hard mask 71 is formed using the sacrificial film 40, and the amorphous silicon layer 30 and the stacked body 20 are processed using the hard mask 71 as a mask. As described above, the effect of the present embodiment is not lost even if the resist film 60 is not subjected to metallization treatment.

While a few embodiments of the disclosure are described, these embodiments are presented by way of example and are not intended to limit the scope of the disclosure. These embodiments may be embodied in various other forms, and various omissions, substitutions, and alterations may be made without departing from the spirit and scope of the disclosure. These embodiments and modifications thereof, as well as being included in the scope and gist of the disclosure, are included in the scope of the claimed disclosure and the equivalents thereof.

What is claimed is:

1. A pattern-forming method comprising:
   forming a first film above a material to be processed;
   processing the first film into a pattern to be formed in the material to be processed;
   providing a second film on the first film and the material to be processed;
   supplying a precursor containing at least one of a metal material or a semiconductor material to the second film;
   removing the first film after supplying the precursor to the second film; and
   processing the material to be processed using the second film, incorporating at least one of the metal material and the semiconductor material, as a mask.

2. The pattern-forming method according to claim 1, wherein
   the first film is at least one of a spin-on carbon containing film or a chemical vapor deposition deposited carbon containing film, and
   the second film is a resin film.

3. The pattern-forming method according to claim 1, wherein
   the second film is a resin containing an acrylic acid ester or a methacrylic acid ester copolymer as a main component thereof.

4. The pattern-forming method according to claim 1, further comprising:
   heating the second film while the precursor is being supplied to the second film to cause the second film to react with the precursor.

5. The pattern-forming method according to claim 4, wherein
   the precursor comprises at least one of aluminum, chromium, manganese, molybdenum, tungsten, titanium, zirconium, and hafnium.

6. The pattern-forming method according to claim 1, wherein
   the second film comprises a material that is more easily metallized by the precursor than is the first film.

7. The pattern forming method according to claim 1, further comprising:
   reacting the second film with the precursor to impregnate the second film with the metal material or the semiconductor material.

8. A method of patterning a material layer, comprising:
   forming a first film layer over the material layer;
   forming a second film layer over the first film layer;
   patterning the second film layer;
   patterning the first film layer using the patterned second film layer as a mask;
   forming a third film layer over the patterned first film layer;
   removing the second film layer, leaving a patterned third film layer having a reverse pattern therein of the pattern in the second film layer; and
   patterning the material layer using the patterned third film layer as a mask, wherein
   at least one of the second film layer or the third film layer is impregnated with one of a semiconductor or a metal material before being used to pattern another layer.

9. The method according to claim 8, further comprising:
   during forming of the third film layer on the second film layer, covering at least a portion of the second film layer with the third film layer;
   polishing away the portion of the third film layer over the second film layer to expose a portion of the second film layer; and
   removing the second film layer exposed in the third film layer by etching.

10. The method according to claim 8, wherein the metal material comprises at least one of aluminum, chromium, manganese, molybdenum, tungsten, titanium, zirconium, and hafnium.

11. The method according to claim 10, wherein the at least one of the second film layer and the third film layer are impregnated with a metal material by exposing at least one of the second film layer and the third film layer to a metal chemical vapor deposition environment.

12. The method according to claim 11, further comprising:

heating the at least one of the second film layer and the third film layer while it is exposed to the chemical vapor deposition environment.

13. The method according to claim 11, further comprising:
heating the at least one of the second film layer and the third film layer after it is exposed to the chemical vapor deposition environment.

14. The method according to claim 8, further comprising:
impregnating the third film layer with a metal material before polishing the third film layer to expose portions of the second film layer therein.

15. The method according to claim 8, further comprising:
patterning the material layer with an etchant using the patterned third layer as a mask, wherein
the third layer has a higher resistance to the etchant than does a chemical vapor deposition deposited carbon material.

16. The method according to claim 8, further comprising:
patterning the material layer with an etchant using the patterned third layer as a mask, wherein the third layer has a higher resistance to the etchant than does a spin on carbon material.

17. A method for manufacturing a semiconductor device comprising:
forming a layer on a substrate;
forming a first film above the first layer;
processing the first film into a pattern to be transferred to the layer;
forming a second film on the first film and the layer;
contacting the second film with a precursor containing at least one of a metal material or a semiconductor material;
removing the first film after contacting the second film with the precursor; and
processing the layer using the second film, impregnated with at least one of the metal material and the semiconductor material, as a mask.

18. The method according to claim 17, wherein the layer comprises a plurality of first layers and a plurality of second layers which are alternately stacked.

19. The method according to claim 17, wherein the second film is impregnated with the metal material.

20. The method according to claim 17, wherein the second film is impregnated with the semiconductor material.

* * * * *